United States Patent [19]

Sakaki

[11] 3,880,726

[45] Apr. 29, 1975

[54] METHOD OF MAKING LITHOGRAPHIC AND OFFSET PRINTING PLATES

[75] Inventor: Hirokazu Sakaki, Odawara, Japan

[73] Assignee: Fuji Photo Film Co., Ltd., Nakanuma. Minami Ashigara-shi, Kanagawa, Japan

[22] Filed: Mar. 21, 1973

[21] Appl. No.: 344,023

Related U.S. Application Data

[62] Division of Ser. No. 274,383, July 24, 1972, Pat. No. 3,841,218.

[30] Foreign Application Priority Data

July 23, 1971 Japan .............................. 46-55015

[52] U.S. Cl. .................................. 204/17; 96/94 R

[51] Int. Cl. ........................... B41c 3/08; B41n 1/04

[58] Field of Search ............. 204/15; 96/36.2, 38.4, 96/86, 94

[56] References Cited

UNITED STATES PATENTS

| | | | |
|---|---|---|---|
| 3,615,483 | 10/1971 | Jonker | 96/38.4 |
| 3,763,004 | 10/1973 | Wainer | 204/15 |

FOREIGN PATENTS OR APPLICATIONS

| | | | |
|---|---|---|---|
| 1,064,726 | 4/1967 | United Kingdom | 96/38.4 |

*Primary Examiner*—T. M. Tufariello

*Attorney, Agent, or Firm*—Sughrue, Rothwell, Mion, Zinn & Macpeak

[57] ABSTRACT

A lithographic and offset printing plate comprising an aluminum support having thereon image areas comprising copper electroplated on a metallic silver image formed in openings of or on an anodic oxidation film corresponding to said image areas of said support is disclosed.

1 Claim, 3 Drawing Figures

METHOD OF MAKING LITHOGRAPHIC AND OFFSET PRINTING PLATES

This is a division of application Ser. No. 274,383, filed July 24, 1972, now U.S. Pat. No. 3,841,218.

BACKGROUND OF THE INVENTION

1. Field of the Invention

The present invention relates to lithographic and offset printing aluminum plates (including aluminium alloy plates) and particularly to lithographic and offset printing plates in which copper (copper plated on metallic silver) is utilized as the image part and an anodic oxidation film is utilized as the non-image part.

2. Description of the Prior Art

It is known to produce a lithographic and offset printing plate by a method in which a printing element composed of a photosensitive resin (for example, a diazo resin etc.) applied on a hydrophilic anodic oxidation film on a surface of an aluminum plate is subjected to a photo-engraving treatment to form a hydrophobic "non-metal" image.

In this printing plate, the hydrophilic non-image part has the property that is "repels inks and is wetted with water" and the hydrophobic image part has the property that it "accepts inks and repels water" with these properties being utilized at printing.

Such a prior art photo-engraving printing plate has a serious disadvantage that it is lacking in abrasion resistance at printing, because the image part is non-metal.

On the other hand, a bimetal printing plate which is a printing plate having a metallic copper image on an aluminum plate is known. This plate is produced by a process which comprises plating copper on the entire surface of the aluminum plate, applying a photosensitive layer thereto, exposing to light, developing to form an image on the coated layer, and dissolving selectively the non-image part using a solution which dissolves only the copper and not the aluminum to expose the aluminum surface and then dissolving and removing the coated layer of the image part to expose a metallic copper image on the aluminum plate.

Additionally, it is known the hydrophilic properties of the anodic oxidation film of the aluminum are superior to that of the aluminum and the abrasion resistance of the anodic oxidation film is superior to that of the aluminum too.

However, it is difficult and troublesome to carry out uniform copper plating on the anodic oxidation film of aluminum having superior hydrophilic properties.

Thus, study and development on printing plates having a metal image (hydrophobic) on the anodic oxidation film of aluminum have become of great interest in the offset printing industry.

Accordingly, an object of the present invention is to provide lithographic and offset printing plates which posses the above-described characteristics and have excellent printing durability.

SUMMARY OF THE INVENTION

The present invention has been attained by providing a printing plate in which electrically conductive metallic silver images are formed in the openings of and on the anodic oxidation film of the aluminum support and the metallic silver image is selectively electroplated with copper.

BRIEF DESCRIPTION OF THE ACCOMPANYING DRAWINGS

DETAILED DESCRIPTION OF THE INVENTION

Figure 1:
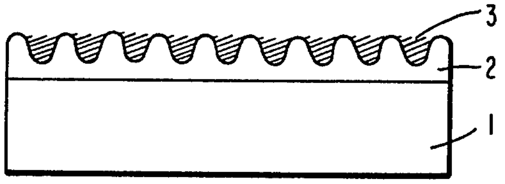
FIG. 1 is a cross sectional view of an anodic oxidation film of aluminum containing silver halide, in which (1) is aluminum, (2) is the anodic oxidation film and (3) is the silver halide.

The printing plate of this invention can be produced as follows.

Namely, a photosensitive aluminum sheet in which a silver halide is incorporated in the openings of an anodic oxidation film formed on the aluminum (for example, "Alphoto," (registered trademark), produced by the Fuji Photo Film Co., refer to U.S. Pat. No. 2,766,119) is exposed to light, developed and fixed to produce a silver image. In the process of U.S. Pat. No. 2,766,119, after the aluminum is anodized, such as by using an electrolyte of a mixture of oxalic acid and oxalates of alkali metals as described at col. 2, lines 24–34 of U.S. Pat. No. 2,766,119, a double decomposition reaction may be used for formation of the silver halide in the oxidized coating. First, the oxidized surface is impregnated with an aqueous solution of a silver salt containing a diffusion-controlling material. Thereafter, the oxidized surface is treated with an aqueous solution of an alkali metal halide to form in situ the silver halide. The diffusion-controlling material or diffusion-barrier is a very dilute solution of a hydrocolloid, such as polyvinyl alcohol, methyl cellulose, gum arabic, purified gelatin, etc., in concentration less than 2%, and preferably in the range of 0.1 to 0.5%. (col. 2, line 72 to col. 3, line 4 of U.S. Pat. No. 2,766,119) Where desired, U.S. Pat. No. 2,766,119 states that a small amount of an oxidizing agent may be included in the solution containing the water-soluble silver salt and minute amount of hydrocolloid and also in the solution of the alkali halide. U.S. Pat. No. 2,766,119 at col. 1, lines 38–53 states that "By the present invention, it now becomes possible to prepare sensitizes surfaces on aluminum, capable of storageability and exposing at convenient times and developing as with other surfaces." The thus resulting silver image, however, has no electric conductivity because the formed silver particles are isolated from each other and are not in electrical contact. Then the sheet is dipped in an aqueous reducing solution containing a silver salt (an intensifier) to deposit selectively metallic silver on the image part, by which electric conductivity is obtained.

Namely, the metallic silver particles deposited on the image part contact each other by which the electric resistivity is lowered and finally the image part becomes electrically conductive. It is possible to vary the decomposition speed and the amount of the metallic silver deposited by varying the composition of the intensifier appropriately.

Then, copper is electro-plated selectively on the metallic silver image which has electric conductivity to produce a printing plate.

This resulting printing plate is excellent in abrasion resistance properties and has the capability that several hundred thousands sheets of distinct prints can be produced therefrom.

Selective copper plating on the electrically conductive silver image part is carried out by connecting a copper plate to an anode and an aluminum sheet having the silver image to a cathode, and applying an electric current to a copper plating solution in an electroplating cell.

Namely, since the anodic oxidation film of the aluminum has a high electric insulating property, when an electric current is applied to the aluminum plate as the support in the copper plating solution after forming the silver image having good electric conductivity in openings of or on the anodic oxidation film, the electric current flows selectively through the parts having a lower resistivity (namely, the parts having good electric conductivity) and thus the copper is plated. The plated copper film is sufficient for practical use if the thickness thereof is about 0.5$\mu$ to 2 or 3$\mu$ or so.

As an intensifier, (which generally comprises a silver ion source, a silver ion reducing agent, e.g., a photographic developer, a silver complexing agent such as thiosulfate, thiocyanate, etc, a preservative such as sodium sulfite and a pH adjusting agent) which can be used in the present invention, a Metol type intensifier and a silver salt-hydroquinone type intensifier are generally used. In order to render the image part electrically conductive, it is generally sufficient to dip the plate in the metol type intensifier for approximately 40 minutes and in the silver salt hydroquinone type intensifier for approximately 20 minutes.

Suitable alloys of aluminum which can be employed are those of copper, magnesium or iron. A copper aluminum alloy is preferred in which the copper content ranges from 0.05 to 1% by weight, preferably from 0.12 to 0.3% by weight.

Any of the copper plating solutions generally used in copper plating are suitable, for example, those copper plating baths disclosed in U.S. Pat. Nos. 2,437,865 (pyrophosphoric acid baths), 2,707,166 (cupric sulfate baths) 2,873,234 (cupric cyanide baths), and *Metal Finishing*, Vol. 57, page 80 (1959) (cupric tetrafluoroborate baths).

The invention will now be described in greater detail by reference to the following examples which are given for the purposes of illustration and are not to be interpreted as limiting the invention.

EXAMPLE 1

Figure 2:
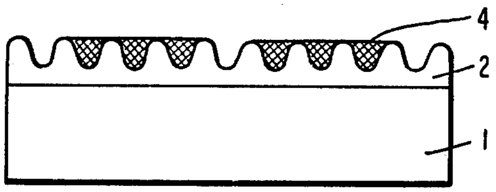
FIG. 2 is a cross sectional view of an intensified anodic oxidation film of aluminum after exposing, developing, fixing and rinsing, in which (4) shows an image part where silver particles connect each other by intensification.
Figure 3:
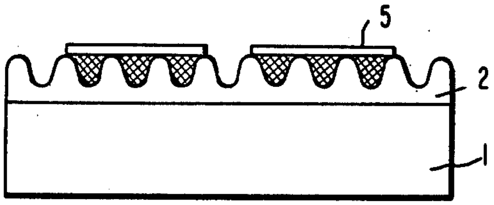
FIG. 3 is a cross section where copper is plated on the image part of connected silver particles as in FIG. 2, in which (5) is deposited copper.

Now referring in detail to FIGS. 1 to 3, a photosensitive aluminum plate which contained silver halide in the openings of an anodic oxidation film formed on an aluminum support in an oxalic acid electrolyte (Alphoto above-described) was imagewise exposed to light, developed and fixed in the following compositions and rinsed to form a metallic silver image.

| | |
|---|---|
| Developer Composition | |
| Ethylene Diamine | 0.6 g |
| Anhydrous Sodium Sulfite | 80 g |
| Hydroquinone | 20 g |

-Continued

| | |
|---|---|
| 1-Phenyl-3-pyrazolidone | 2 g |
| Sodium Thiosulfate.5$H_2O$ | 60 g |
| Potassium Bromide | 1 g |
| Potassium Thiocyanate | 10 g |
| Sodium Hydroxide | 15 g |
| Water to make | 1 liter |
| Developing time: | 2 seconds |
| Fixing Solution Composition: | |
| Monosodium Phosphate | 20 g |
| Ammonium Thiosulfate | 150 g |
| Potassium Pyrosulfite | 50 g |
| Ammonium Thiocyanate | 50 g |
| Water to make | 1 liter |
| Fixing time: | 5 seconds. |

The plate was then dipped in an intensifier having the following composition for 30 – 60 minutes to render the image electrically conductive.

| | |
|---|---|
| $AgNO_3$ | 60 g |
| $Na_2SO_3$ | 60 g |
| $Na_2S_2O_3$.5$H_2O$ | 90 – 105 g |
| $Na_2CO_3$ | 15 g |
| Metol | 25 g |
| Water | 6 liters |

Further, a portion of the plate was dipped in a 10% aqueous sodium hydroxide solution for 3 minutes to dissolve and remove a part of the anodic oxidation film which was unnecessary as the printing plate. After connecting the exposed part of the aluminum plate having the silver image to a cathode, the plate was subjected to copper plating in a pyrophosphoric acid copper plating bath [solution diluted two times of Pyrodonconc (commercial name) produced by the Murata Chemical Co.] using a copper plate as an anode to form an electroplated copper image part (5) by which a lithographic and offset printing plate was produced.

EXAMPLE 2

After dipping an Alphoto plate on which an image was formed in the same manner as described in Example 1 in an intensifier having the following composition for 30 – 60 minutes, it was subjected to copper plating in a pyrophosphoric acid plating bath to produce a printing plate.

| | |
|---|---|
| $AgNO_3$ | 60 g |
| $Na_2SO_3$ | 75 g |
| $Na_2S_2O_3$.5$H_2O$ | 90 – 105 g |
| Metol | 25 g |
| Water | 6 liters |

EXAMPLE 3

A printing plate was produced in the same manner as described in Example 1 but an intensifier having the following composition was used.

| | |
|---|---|
| $AgNO_3$ | 91.5 g |
| $Na_2SO_3$ | 25 g |
| $Na_2S_2O_3$.5$H_2O$ | 160 g |
| Hydroquinone | 25 g |
| $NH_4SCN$ | 160 g |
| Water | 3 liters |

EXAMPLE 4

A printing plate was produced in the same manner as described in Example 1 but an intensifier having the following composition was used.

| | |
|---|---|
| $AgNO_3$ | 60 g |
| $Na_2SO_3$ | 75 g |
| $Na_2S_2O_3.5H_2O$ | 105 g |
| Metol | 25 g |
| $CuSO_4$ | 0.2 g |
| Water | 6 liters |

While the invention has been described in detail and in terms of specific embodiments thereof, it will be apparent to one skilled in the art that various changes and modifications can be made therein without departing from the spirit and scope thereof.

What is claimed is:

1. A process for preparing a lithographic and offset printing plate comprising imagewise exposing to light a light sensitive elemement comprising an aluminum support having thereon an anodic oxidation film and a silver halide contained in the openings of or on said film, developing said silver halide to form metallic silver particles in the image areas exposed to light, converting said metallic silver particles in said image areas to an electrically conductive silver image, and selectively electroplating said electrically conductive silver image with copper, said silver halide having been formed by first treating said anodic oxidation film on said aluminum support with an aqueous solution of a silver salt containing a diffusion-controlling dilute solution of a hydrocolloid and then treating with an aqueous solution of an alkali metal halide.

* * * * *